United States Patent [19]
Eulenberg et al.

[11] Patent Number: 5,272,658
[45] Date of Patent: Dec. 21, 1993

[54] LONG-TERM INTEGRATOR

[75] Inventors: Hannspeter Eulenberg, Aachen, Fed. Rep. of Germany; Horst Larue, Kerkrade, Netherlands; Roman Goslawski, Aachen, Fed. Rep. of Germany

[73] Assignee: Forschungszentrum Julich GmbH, Julich, Fed. Rep. of Germany

[21] Appl. No.: 895,347

[22] Filed: Jun. 8, 1992

[30] Foreign Application Priority Data

Jun. 17, 1991 [DE] Fed. Rep. of Germany ....... 4119885

[51] Int. Cl.$^5$ .......................................... G06F 15/328
[52] U.S. Cl. .................................................. 364/733
[58] Field of Search ................... 364/733, 715.01, 735, 364/605

[56] References Cited

U.S. PATENT DOCUMENTS 4,023,019  5/1977  Leibowitz et al. ................. 364/733
4,692,890  9/1987  Arseneau ........................... 364/733

FOREIGN PATENT DOCUMENTS 3331334  8/1984  Fed. Rep. of Germany .

Primary Examiner—Long T. Nguyen
Attorney, Agent, or Firm—Herbert Dubno

[57] ABSTRACT

A long-term integrator, e.g. for integrating the voltage signal from a coil measuring magnetic induction, can include a push-pull modulator followed by an analog-digital converter, a digital signal processor and a digital analog converter in cascade. Offset voltage in the analog-digital converter or an amplifier upstream thereof is nullified in the digital signal processor by modulating it as the measured signal is demodulated, thereby balancing out alternate polarity portions of the offset voltage.

16 Claims, 6 Drawing Sheets

LONG-TERM INTEGRATOR

FIELD OF THE INVENTION

Our present invention relates to a long-term integrator connectable to a sensor outputting a measurement voltage and, more particularly, to a long term integrator which comprises, in cascade, an analog-digital converter, a digital signal processor for calculating the integral value growth or increment, and a digital-analog converter.

BACKGROUND OF THE INVENTION

Long-term integrators can be used, for example, for the measurement of a magnetic flux and determining derivative values therefrom. The sensor for this purpose can include a coil whose output or measurement voltage is applied to the long term integrator.

In prior art analog integrators, a series resistance of an operational amplifier is provided at the input side thereof and a condenser forms a parallel network therewith. Such long-term integrators have been found to have drawbacks especially with respect to their drift and poor long term precision. These drawbacks are not readily controllable.

The input steady or quiescent current and the offset voltage of the operational amplifier, for example, cause errors in the final result which are not negligible. The integration constant is dependent upon the capacity of the condenser and the resistance of the series resistor which cannot be selected at will. Error sources also include the leakage current through the condenser and its polarization voltage.

Another kind of integration process utilizes counter methods. In these methods, signals are integrated by summing in accordance with the trapezoidal law. A drawback of such systems is the relatively low numerical precision and slow speed of the integration process.

With the advances in microelectronics in recent years and, especially, the development of programmable digital signal processors (DSP) analog processes can be replaced by digital processes.

In the digital signal processing, arithmetic operations, like addition and multiplication are used. Such operations are free from variations and fluctuations of the type which has characterized nondigital integration methods.

It is thus possible to realize signal processing systems with very high precisions using digital techniques. These are applicable to long term integrators as well.

While digital signal processing has significantly reduced tendencies to error, offset voltages which can result from the analog-digital converter and the optionally provided DC voltage measurement amplifier upstream thereof, cannot be recognized or determined by the processor and thus cannot be compensated.

OBJECTS OF THE INVENTION

It is, therefore, the principal object of the present invention to provide a long term integrator, especially for the purposes described, which has higher precision than error integrators.

Another object of this invention is to provide an improved long term integrator which is free from drawbacks of the prior art techniques.

SUMMARY OF THE INVENTION

These objects and others which will become apparent hereinafter are achieved, in accordance with the present invention in a long term integrator which comprises a digital signal processor operating in accordance with the Kepler-method and upstream of which a push-pull modulator is provided for modulation of the measurement voltage and so that the processor carries out the demodulation of the measurement voltage and also the modulation of the offset voltage which may be superimposed on the measurement voltage and can be produced downstream of the push-pull modulator, prior to calculation of the integral increase whereby modulation and demodulation alternate synchronously in a shifting cadence or clock cadence periodically.

The calculation of the integral increment according to the Kepler-method is effected in accordance with the formula $$Y = (X_{n-2} + 4X_{n-1} + X_n) \cdot T_a / 3,$$

wherein $Y$: integral increment or growth (integral increase);
$T_a$: scanning time;
$X_n$: scanning value of the signal to be integrated at $X_n \cdot t_a$;
$N$: 2, 3, 4 ...

The signal at the input to the long term integrator is amplitude modulated and may initially be free from the offset voltage, so as not to lose the advantage of digital signal processing (for example temperature stability). Any necessary amplification of the signal to the push-pull modulator is effected by a direct-current measurement amplifier downstream thereof. This amplifier has no RC coupling and does not have any long term changes associated therewith. Advantageously, the push-pull modulator is formed by CMOS switches or circuitry which itself contributes no offset voltage. Only in the downstream circuitry, in the DC measured voltage amplifier and in the analog-digital converter do offset voltages arise which are adversely superimposed on the measured voltage.

In the demodulation effected in the processor, the previously modulated signal is demodulated, the offset voltage is modulated to a rectangular voltage signal (or to a corresponding value). This ensures that the offset voltage in the subsequent integration by the advance-value formation step will be transformed into a null or zero level contribution and will therefore be fully compensated.

In a particularly, advantageous embodiment of the long term integrator, the push-pull modulator and signal processor are so matched that a Kepler integration interval corresponds to a multiple of the switching cycles of the shifting cadence.

If one Kepler integration interval corresponds to three modulation steps and two Kepler integration intervals are effected in the processor, there will be a weighting of the modulated signal segments with the factors +1, +4, −1, −1, −4, +1, so that the scanning values are switched over groupwise and whereby the mean value is always read after two Kepler integration steps.

In order to determine the integral growth or increase with sufficient precision, the analog-digital converter must operate with the full word width of the analog-digital converter over the entire integration in order to avoid chopping and rounding errors.

Long integration periods are then only attained when expensive DSP's with large word widths (e.g. 32 bits) are used.

The use of expensive DSP can, however, be avoided in accordance with a further embodiment of the long term integrator of the invention when the digital signal processor, which in this case alone determines the integral increase, is followed by a recursively operated adding unit determining the complete integral.

In this manner, instead of a more expensive DSP, a less expensive processor can be used without detriment to the accuracy.

BRIEF DESCRIPTION OF THE DRAWING

In the accompanying drawing, an embodiment of the long term integrator of the present invention has been illustrated and is described in connection with timing diagrams of the signals which result therein.

In the drawing.

SPECIFIC DESCRIPTION

Figure 1:
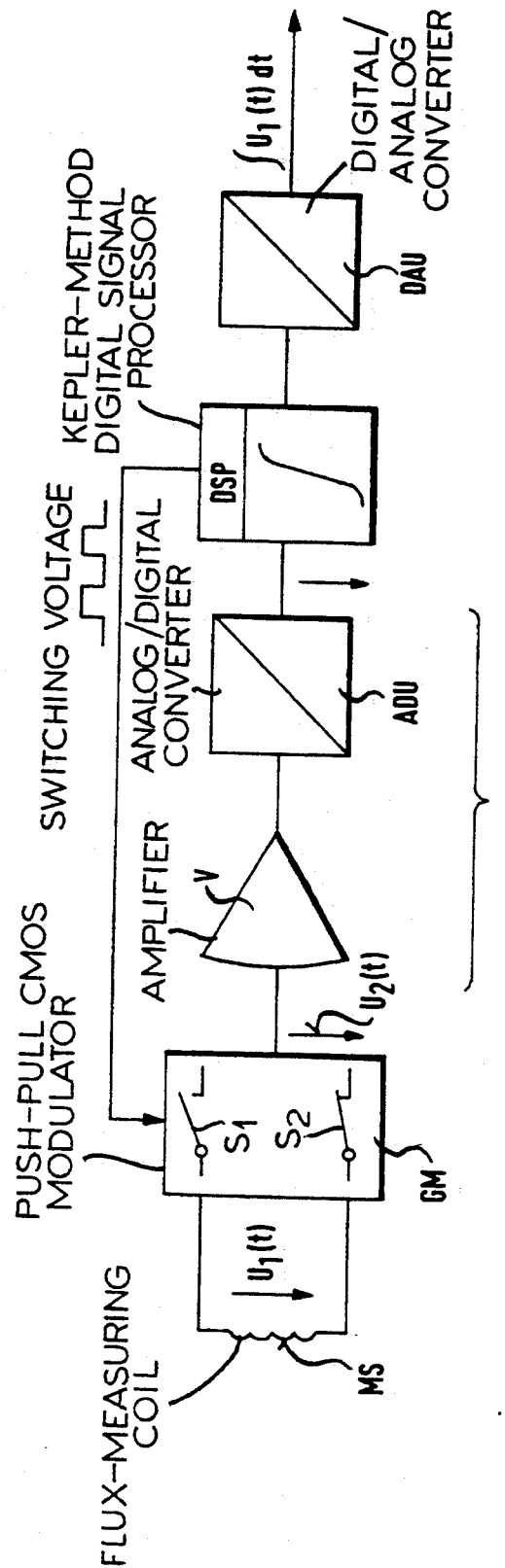
FIG. 1 is a block diagram of a long term integrator according to the invention.

As will be apparent from FIG. 1, the long-term integrator of the present invention comprises an analog-digital converter ADU in cascade with a digital signal processor DSP and a digital=analog converter DAU. The analog-digital converter is provided downstream from a DC measurement signal amplifier V, upstream of which a push-pull modulator GM is provided.

The measurement signal $U_1(t)$ is supplied to the push-pull modulator GM from a measurement coil MS which is shown to measure a magnetic flux and, as a flux/voltage transducer, to convert the sensed flux to the measurement voltage.

The output of the push-pull modulator GM, as amplified by the amplifier V is analog and is converted in the analog-digital converter ADU into digital values which are integrated in the digital signal processor DSP and the digital values, in turn, are converted by the digital-analog converter DAU to the analog voltage $\int U_1(t)dt$.

Figure 2:
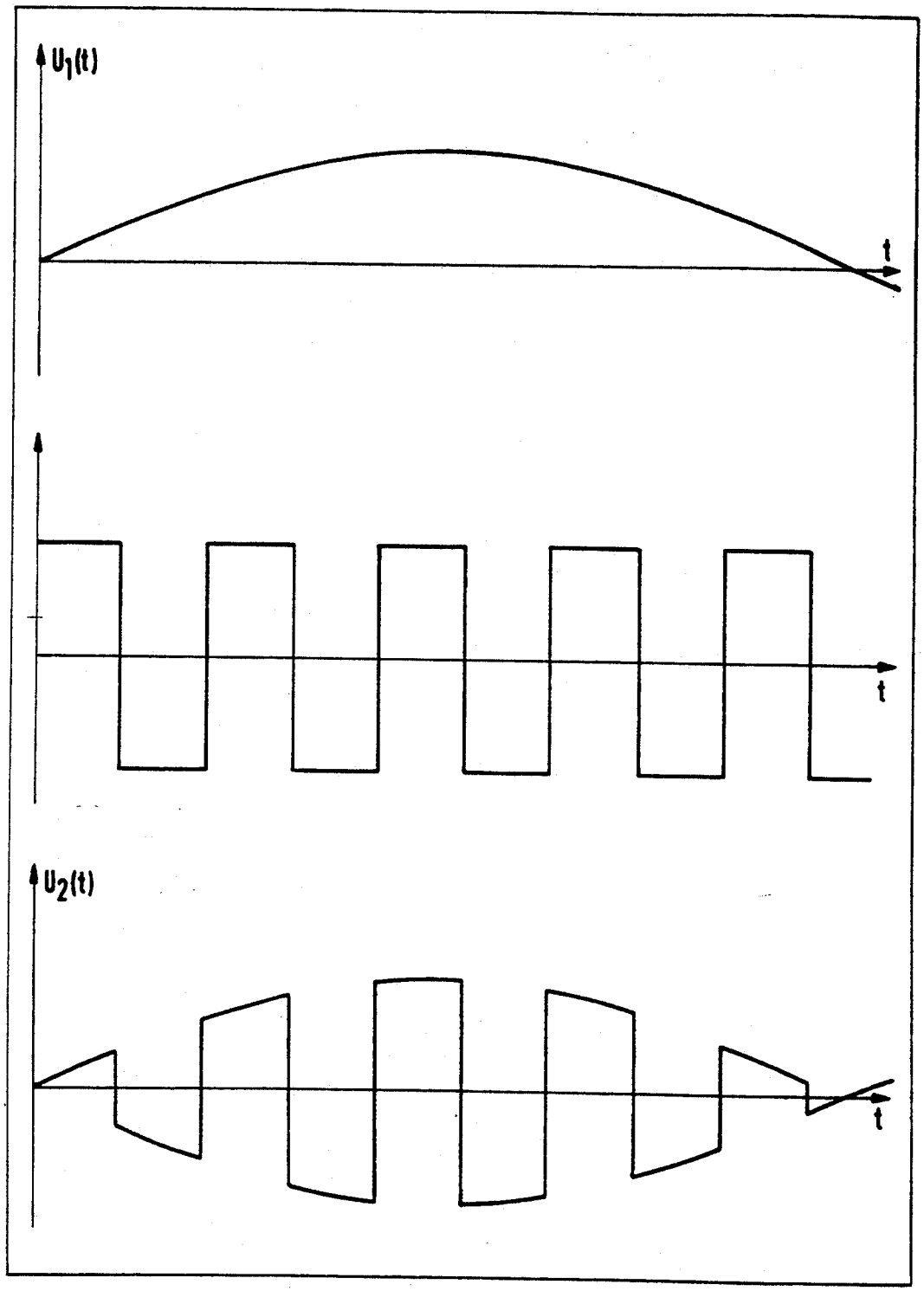
FIG. 2 is a timing diagram of the signal voltages of the switching cadence of the push-pull modulator and the rectangular voltage of the modulated signal voltage without an offset voltage.

The functioning of the push-pull modulator G will be more readily apparent with reference to the timing diagram of FIG. 2. The uppermost graph of this timing diagram illustrates the amplitude of the measurement signal $U_1(t)$ plotted along the ordinate versus time t plotted along the abscissa. The intermediate diagram illustrates the switch-over cadence of the push-pull modulator GM and the lower diagram shows the amplitude modulated signal $U_2(t)$ corresponding to the signal $U_1$ modulated by the rectangular switching signals of the modulator.

Figure 3:
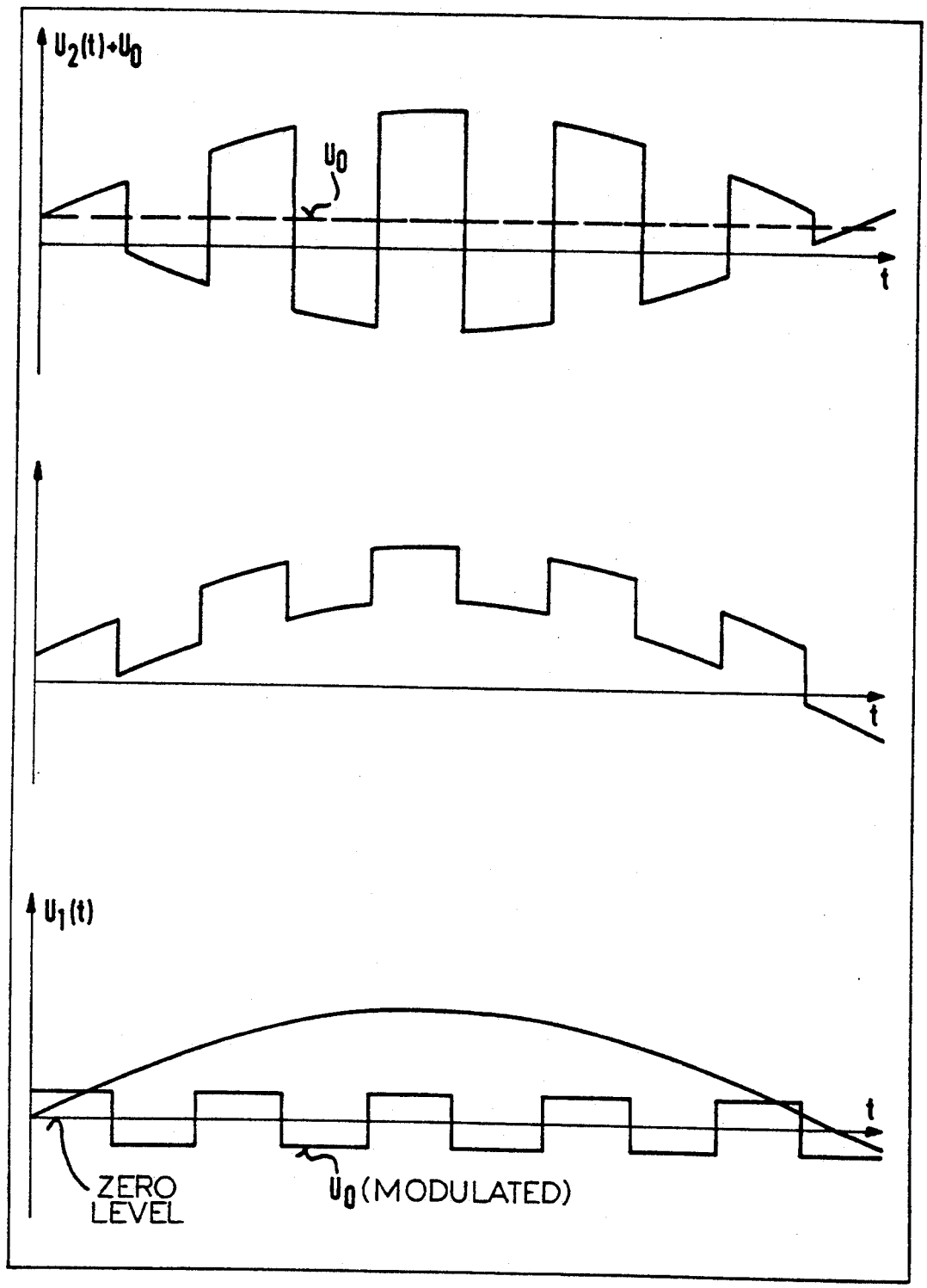
FIG. 3 is a timing diagram of the modulated signal voltage as in FIG. 2 but illustrating a superimposed offset voltage, FIG. 3 also illustrating the demodulated signal as the sum of the signal voltage and the modulated offset voltage as well as the signal voltage and modulated offset voltage separately.

The upper diagram of FIG. 3 shows the modulated signal $U_2(t)$ upon which an offset voltage $U_o$ can be superimposed as derived from the amplifier V and/or from the analog-digital converter ADU. The signals in the middle and lower timing diagrams in FIG. 3 are analog signals which represent the signals processed in the digital signal processor. The middle diagram shows the demodulated signal turned back into the proper position, as the sum of the signal voltage $U_1(t)$ and the modulated offset voltage $U_o$ which has alternating segments of opposite polarity. The lower diagram shows the input measurement signal $U_1(t)$ and the modulated oppositely poled offset voltage separately in order to show clearly that the offset voltage has its levels alternately t opposite sides of a zero point and can be fully compensated by the present method so that the end result, namely, the integral $\int U_1(t)dt$ is free from any term contributed by the offset voltage $U_o$.

It should be noted that the processing of the signal in the digital signal processor DSP is effected at the switch-over cadence of the push-pull modulator, which cadence is represented by the switching voltage illustrated in FIG. 1.

In FIG. 3, as previously indicated, the action of the digital signal processor is illustrated in analog terms whereas in reality the processing is carried out purely digitally.

Figure 4:
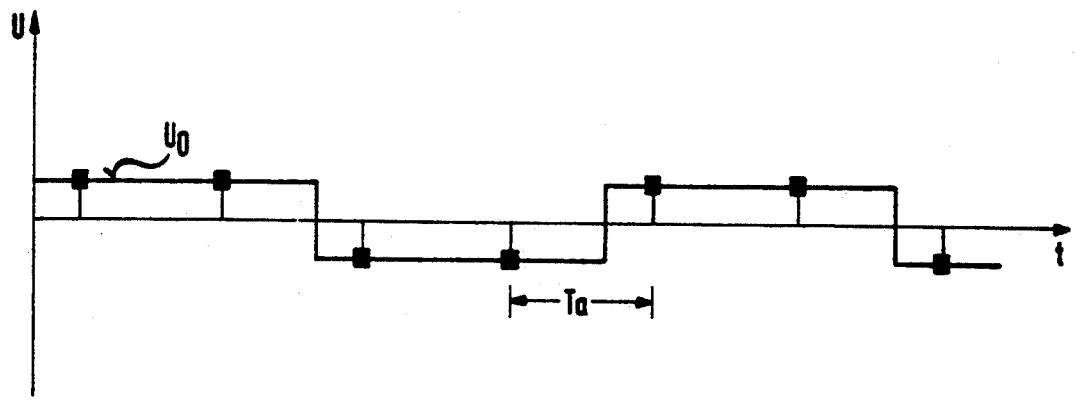
FIG. 4 timing diagram of the scanning values of the offset voltage in the digital signal processor, the Kepler integration process and the graph of the offset error.
Figure 4:
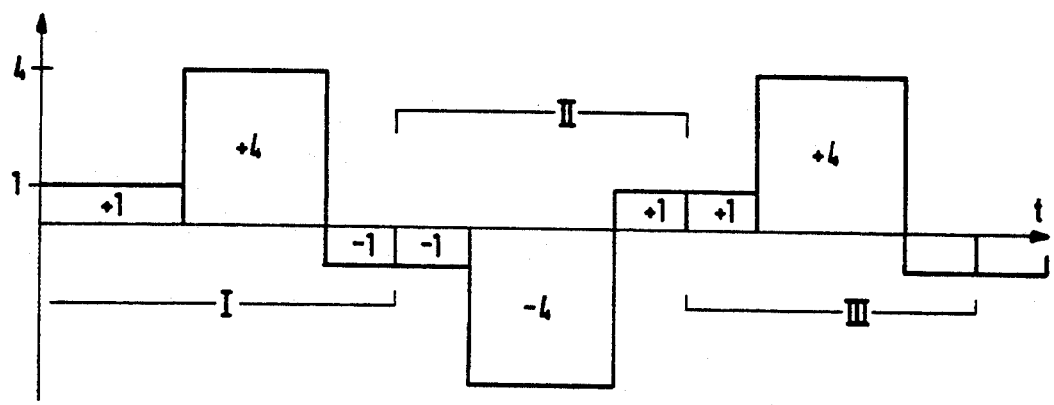
Figure 4:
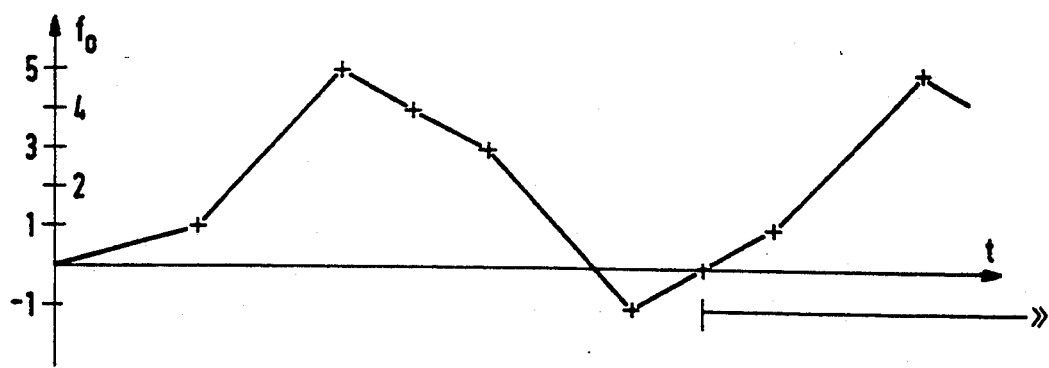

FIG. 4 shows the processing of the offset voltage utilizing the Kepler-method for determining the integral increase.

The upper timing diagram shows the reversely poled segments of the offset voltage $U_o$ and the keying values formed in the digital signal processor DSP for the offset voltage Ta representing the keying time.

The middle timing diagram shows the ±1, ±4 waiting of the Kepler integration and the integration intervals I, II and III respectively. In the lower timing diagram the offset error $f_o$ is plotted against time and the integral value ascertained after two of these intervals.

Figure 5:
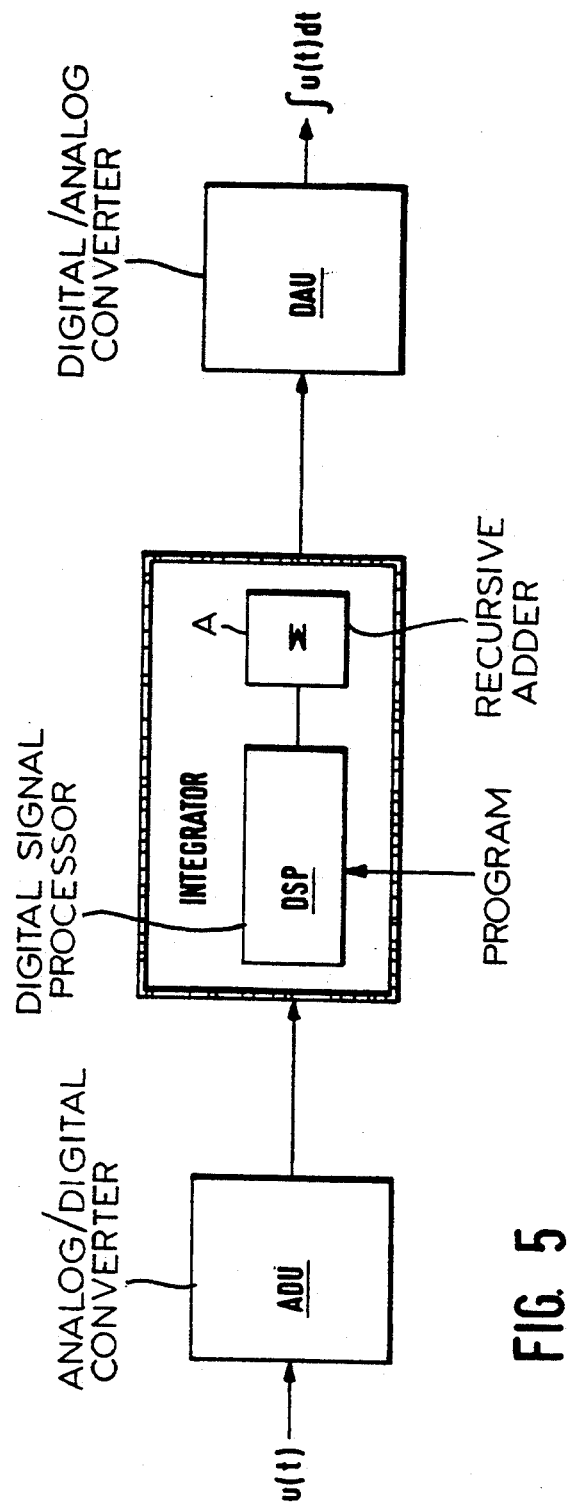
FIG. 5 is a block diagram of a long term integrator with separate recursively operating adder.

FIG. 5 shows, in simplified form, circuit according to the invention in which the push-pull modulator and amplifier have been omitted although they are provided upstream of the analog-digital converter ADU, but where the digital signal processor DSP of the integrator is provided upstream of an adder A. The digital signal processor is programmed to carry out the Kepler-method. The DSP can be connected to the modulator GM as in FIG. 1 by a feedback loop supplying the switching voltage pulses.

Figure 6:
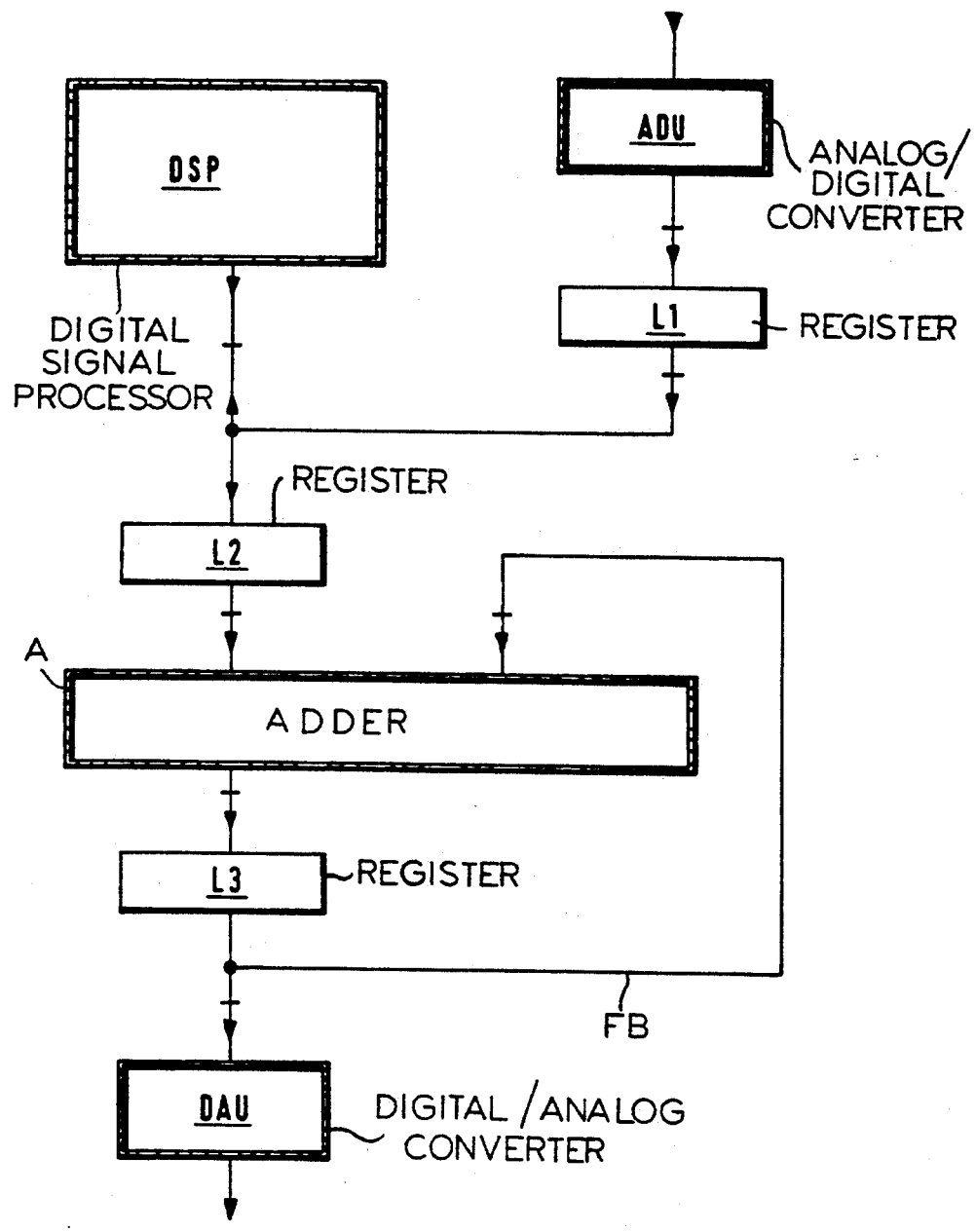
FIG. 6 is a diagram of a portion of a long term integrator according to FIG. 8.

As indicated in FIG. 6, the adder is recursively operated and thus the value from the analog-digital converter, stored in the register L1 is supplied to a register L2 which also receives the value from the digital signal processor. Intermediate storage of the value produced by the adder A is stored in the register L3 which has a recursive feedback loop FB and this value is then supplied to the digital analog converter DAU. This system allows a low cost digital signal processor to be employed where a 32 bit or long word unit may not be necessary. The switching elements of the push-pull modulator GM, represented at S1 and S2 can be CMOS switches and the modulator GM and the signal processor DSP are so matched that each Kepler integration interval I, II, III corresponds to three keying intervals Ta and switching cadences of the modulator.

We claim:

1. A long-term integrator, comprising:
   a push-pull modulator connected to a source of measurement voltage for modulating the voltage from said source;
   an analog-digital converter connected to said push-pull modulator;
   a Kepler-method digital signal processor connected to said analog-digital converter for effecting demodulation of the measurement voltage and the modulation of an offset voltage which can have been superimposed on the measurement voltage downstream of said push-pull modulator before calculation of an integral increase value, the modulation and demodulation being effected in a synchronous switch-over cadence; and
   a digital-analog converter connected to said digital signal processor.

2. The long-term integrator defined in claim 1, further comprising a direct-current measurement voltage amplifier downstream of said push-pull modulator and upstream of said analog-digital converter.

3. The long-term integrator defined in claim 1 wherein said push-pull modulator is formed with complementary metal oxide silicon (CMOS) switching elements.

4. The long-term integrator defined in claim 1 wherein said push-pull modulator and said digital signal processor are so matched that a Kepler integration interval of said digital signal processor corresponds to a multiple of said switch-over cadence.

5. The long-term integrator defined in claim 4 wherein said Kepler integration interval of said digital signal processor corresponds to three modulation steps of said switch-over cadence.

6. The long-term integrator defined in claim 5 wherein said push-pull modulator and said digital signal processor are so matched that over two successive Kepler integration intervals in the digital signal processor, a weighting of the modulated signal segments is effected with the factors $+1, +4, -1, -1, -4, +1$.

7. The long-term integrator defined in claim 6, further comprising a direct-current measurement voltage amplifier downstream of said push-pull modulator and upstream of said analog-digital converter.

8. The long-term integrator defined in claim 6 wherein said push-pull modulator is formed with complementary metal oxide silicon (CMOS) switching elements.

9. The long-term integrator defined in claim 1 wherein said digital signal processor determines said integral increase and is followed by a recursively operating adder to determine a total integral.

10. The long-term integrator defined in claim 9, further comprising a direct-current measurement voltage amplifier downstream of said push-pull modulator and upstream of said analog-digital converter.

11. The long-term integrator defined in claim 9 wherein said push-pull modulator is formed with complementary metal oxide silicon (CMOS) switching elements.

12. The long-term integrator defined in claim 9 wherein said push-pull modulator and said digital signal processor are so matched that a Kepler integration interval of said digital signal processor corresponds to a multiple of said switch-over cadence.

13. The long-term integrator defined in claim 12 wherein said Kepler integration interval of said digital signal processor corresponds to three modulation steps of said switch-over cadence.

14. The long-term integrator defined in claim 13 wherein said push-pull modulator and said digital signal processor are so matched that over two successive Kepler integration intervals in the digital signal processor, a weighting of the modulated signal segments is effected with the factors $+1, +4, -1, -1, -4, +1$.

15. The long-term integrator defined in claim 14, further comprising a direct-current measurement voltage amplifier downstream of said push-pull modulator and upstream of said analog-digital converter.

16. The long-term integrator defined in claim 15 wherein said push-pull modulator is formed with complementary metal oxide silicon (CMOS) switching elements.

* * * * *